(12) United States Patent
Khanifar et al.

(10) Patent No.: US 7,038,539 B2
(45) Date of Patent: May 2, 2006

(54) RF AMPLIFIER EMPLOYING ACTIVE LOAD LINEARIZATION

(75) Inventors: Ahmad Khanifar, Laguna Hills, CA (US); Nikolai Maslennikov, Huntington Beach, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 10/837,838

(22) Filed: May 3, 2004

(65) Prior Publication Data
US 2004/0222847 A1 Nov. 11, 2004

Related U.S. Application Data

(60) Provisional application No. 60/468,309, filed on May 6, 2003.

(51) Int. Cl.
*H03F 1/14* (2006.01)
(52) U.S. Cl. ...................... 330/136; 330/51; 330/124 R
(58) Field of Classification Search ................ 330/136, 330/51, 124 R
See application file for complete search history.

(56) References Cited

U.S. PATENT DOCUMENTS

| | | | |
|---|---|---|---|
| 2,210,028 A | 8/1940 | Doherty | 330/84 |
| 4,985,686 A | 1/1991 | Davidson et al. | 330/124 R |
| 5,430,411 A * | 7/1995 | Boulic | 330/124 R |
| 5,739,723 A | 4/1998 | Sigmon et al. | 330/295 |
| 5,757,229 A | 5/1998 | Mitzlaff | 330/124 R |
| 6,300,826 B1 | 10/2001 | Mathe et al. | 330/10 |
| 6,437,641 B1 | 8/2002 | Bar-David | 330/10 |
| 6,469,581 B1 * | 10/2002 | Kobayashi | 330/295 |
| 6,492,867 B1 | 12/2002 | Bar-David | 330/10 |
| 6,496,061 B1 * | 12/2002 | Bloom et al. | 330/124 R |
| 6,683,492 B1 | 1/2004 | Krishnapura et al. | 327/552 |
| 6,683,499 B1 * | 1/2004 | Lautzenhiser et al. | 330/295 |
| 6,735,421 B1 * | 5/2004 | Claxton et al. | 330/295 |
| 2002/0171477 A1 | 11/2002 | Nakayama et al. | 330/53 |
| 2004/0174212 A1 | 9/2004 | Kim et al. | 330/124 R |

OTHER PUBLICATIONS

Upton, David M. et al., A New Circuit Topology to Realize High Efficiency, High Linearity, and High Power Microwave Amplifiers, RAWCON '98 Proceedings, pp. 317-320 (1998).

(Continued)

*Primary Examiner*—Khanh V. Nguyen
(74) *Attorney, Agent, or Firm*—Myers Dawes Andras & Sherman, LLP.

(57) ABSTRACT

A method and apparatus for linear amplification of a modulated carrier signal or multi-carrier signal is disclosed. The linearity of the amplifier is improved by employing dynamic load line adjustments. A second current source coupled to the amplifier output load is turned on just before the amplifier reaches a nonlinear regime and reduces the effective load to prevent the amplifier allowing sufficient power to reach the nonlinear regime near saturation. The technique is particularly advantageous for amplification of a signal with large peak to average ratio.

26 Claims, 4 Drawing Sheets

OTHER PUBLICATIONS

Iwamoto, Masaya et al., An Extended Doherty Amplifier with High Efficiency Over a Wide Power Range, 2001 IEEE Transactions on Microwave Theory and Techniques, vol. 49, No. 12, pp. 2472-2479 (2001).

Yang, Youngoo et al., Experimental Investigation on Efficiency and Linearity of Microwave Doherty Amplifier, 2001 IEEE MTT-S Digest, pp. 1367-1370 (2001).

McMorrow, Robert J. et al., the Microwave Doherty Amplifier, 1994 IEEE MTT-S Digest. pp. 1653-1656 (1994).

Gonzalez, Guillermo, Microwave Transistor Amplifiers: Analysis and Design, Prentice-Hall, 1997, Second Edition, ISBN 0-13-254335-4, pp. 212-216.

Matthaei, George L. et al., Microwave Filters, Impedance-Matching Networks, and Coupling Structures, Artech House 1980, ISBN 0-89006-099-1, pp. 434-437.

Wood, Simon M. et al., A High Power, High Efficiency UMTS Amplifier Using a Novel Doherty Configuration, 2003 IEEE, pp. 329-332.

N. Srirattana et al., A High Efficiency Multistage Doherty Power Amplifier for WCDMA, 2003 IEEE, pp. 397-400.

Bae, Seongjun et al., Bias-Switching Quasi-Doherty-Type Amplifier for CDMA Handset Applications, 2003 IEEE Radio Frequency Integated Circuits Symposium, pp. 137-140.

Zhao, Yu et al., Doherty Amplifier with DSP Control to Improve Performance in CDMA Operation, 2003 IEEE MTT-S Digest, pp. 687-690.

Lees, Jonathan, Single-Tone Optimisation of and Adaptive-Bias Doherty Structure, 2003 IEEE MTT-S Digest, pp. 2213-2216.

* cited by examiner

RF AMPLIFIER EMPLOYING ACTIVE LOAD LINEARIZATION

RELATED APPLICATION INFORMATION

The present application claims priority under 35 USC 119(e) of provisional application Ser. No. 60/468,309 filed May 6, 2003, the disclosure of which is incorporated herein by reference in its entirety.

BACKGROUND OF THE INVENTION

1. Field of the Invention

The present invention is related to radio frequency (RF) amplifiers. More particularly, the present invention is related to radio frequency power amplifiers used in wireless communication applications such as cellular base stations where signals with high peak to average ratios are generated and amplified.

2. Description of the Prior Art and Related Background Information

Most digitally modulated carrier signals used in modern telecommunication systems have an amplitude envelope showing a large peak to average ratio. In such systems, to preserve signal integrity and prevent transmitter spurious emissions, the amplifying device has to maintain linearity by having sufficient headroom for the signal peaks, albeit producing a modest average output power and therefore having a low efficiency. Hence, the amplifier efficiency and its linearity are practically mutually exclusive.

Even from the early days of AM broadcasting and in more recent complex transmission systems such as satellite communications, cable TV applications and cellular telephony, the carrier amplifiers have been mostly used in conjunction with some means of linearization to achieve the required performance. Feedback and in RF frequency bands, feedforward linearization are widely used linearization techniques. Analog predistortion has been used since the early days of satellite communication where frequency division multiple access (FDMA) systems were employed for sharing transponder bandwidth. In recent years, with the advent of digital signal processing (DSP), digital predistortion has received much attention.

Nonetheless, despite the significant efforts directed to linearization of RF power amplifiers, such techniques typically come at the expense of amplifier efficiency. Therefore, it is desirable to have additional techniques to achieve linearity and improve efficiency in RF amplifiers. Also, it is desirable to provide linearization techniques which may have reduced costs compared to the above known techniques, or which may improve performance, employed alone or in combination with the above techniques.

SUMMARY OF THE INVENTION

In a first aspect the present invention provides a power amplifier adapted for amplifying an RF input signal comprising an input for receiving an RF input signal and an amplifier device coupled to the input which receives the input signal and provides an amplified output signal. A dynamically varying output load is coupled to the amplifier device, including a variable impedance device coupled to the amplifier device so as to vary the impedance across the amplifier device as a function of the input signal. The impedance across the amplifier device is substantially constant through a first portion of the input signal power range corresponding to the lower major portion of the input signal power range and drops substantially for a second higher power portion of the input signal power range. The variable impedance device has approximately zero impedance through the first portion of the input signal power range and a substantially greater impedance through the second portion of the input signal power range. The power amplifier further comprises an output coupled to the output load for outputting the amplified output signal.

In a preferred embodiment of the power amplifier, the second portion of the input signal power range comprises the signal power range greater than about 6–10 dB below the amplifier device saturation region. The impedance across the amplifier device in the second portion of the input signal power range is preferably about 50% of the impedance across the amplifier device in the first portion of the input signal power range. The variable impedance device presents negligible load to the first device in the first portion of the input signal power range. The variable impedance device may have an impedance peak in a lower power region of the second portion of the input signal power range and a substantially constant impedance in a higher power region of the second portion of the input signal power range. The substantially constant impedance of the variable impedance device is approximately equal to the impedance across the amplifier device in the higher power region of the second portion of the input signal power range. The dynamically varying output load preferably further comprises a fixed load and the variable impedance device is coupled in parallel with the amplifier device to the fixed load. The amplifier device may comprise a field effect transistor biased in class A or class AB. The dynamically varying output load may further comprise transformer means for transforming the impedance of the fixed load by a factor of about 1.5–3. The dynamically varying output load may also further comprise means for adjusting the relative phase of the signals applied to the fixed load from the variable impedance device and the amplifier device.

According to another aspect the present invention provides a power amplifier circuit comprising an input for receiving an input signal and a coupler for receiving the input signal and splitting the input signal on two signal paths. A first amplifier device having a first turn-on threshold is coupled to the coupler on a first of the two signal paths and receives the input signal and provides a first amplified signal. A second amplifier device is coupled to the coupler on a second of the two signal paths and receives the input signal and provides a second amplified signal. The second amplifier device has a second turn-on threshold and an impedance near zero when the input signal is below the second turn-on threshold. An output load is coupled to the first and second amplifier devices. The power amplifier circuit further comprises a DC power supply and a first bias circuit coupled to the first amplifier device and the DC power supply. The first bias circuit provides a first bias to the first amplifier device setting the first turn-on threshold of the first amplifier device. A second bias circuit is coupled to the second amplifier device and the DC power supply and provides a second bias to the second amplifier device setting the second turn-on threshold of the second amplifier device. The second turn-on threshold is set at a substantially higher level than the first turn-on threshold, the second turn-on threshold corresponding to a peak power region of the input signal. An output is coupled to the first and second amplifier devices via the output load and provides an amplified output signal.

In a preferred embodiment of the power amplifier circuit, the second turn-on threshold of the second amplifier device is about 6–10 dB below device saturation of the first amplifier device. The second amplifier device may have a transitional region after the turn-on threshold and a fully turned on region at higher power and the real component of the impedance across the first and second amplifier devices are preferably substantially equal when the second amplifier device is in the fully turned on region. The first and second amplifier devices may be field effect transistors having respective source and gate terminals, and are coupled to receive the input signal applied to their respective gate terminals. The first and second bias circuits are coupled to the respective gate terminals of the first and second amplifier devices and provide first and second fixed voltage bias levels to the respective gate terminals of the first and second amplifier devices to set the respective turn-on thresholds of the first and second amplifier devices. The first and second bias circuits may preferably comprise first and second resistor networks coupled to the DC supply and the respective gate terminals of the first and second amplifier devices. The first and second resistor networks may comprise one or more common resistors. The first and second bias circuits may further comprise first and second low pass matching circuits coupled between the DC supply and the respective gate terminals of the first and second amplifier devices. The power amplifier circuit may further comprise a 90 degree phase inverting circuit coupled between the output load and the first or second amplifier device. The phase inverting circuit may be a K inverter circuit. The coupler may comprise a 90 degree hybrid coupler and the phase inverting circuit preferably adjusts the relative phase of the signals from the first and second amplifiers to compensate for the effect of the 90 degree hybrid coupler and relative phase shifts introduced by the amplifier devices and bias circuits. A transformer may also be provided coupled to the first and second amplifier devices in parallel with the output load.

According to another aspect the present invention provides a method for linear and efficient amplification of an RF input signal. The method comprises receiving an RF input signal and sampling the input signal to provide a sampled input signal. The method further comprises amplifying the input signal with a first amplifier device and applying the amplified signal across a load to provide an output signal. The method also comprises amplifying the sampled input signal with a second amplifier device and applying the amplified sampled input signal to the output load in parallel with said amplified signal. The method further comprises dynamically varying the impedance of the second amplifier device from a first substantially constant impedance near zero value over the lower major portion of the input signal power range to a second higher impedance in a peak power range of the input signal to substantially reduce the load of the first amplifier device when the input signal approaches the peak power region while maintaining the load substantially constant over the lower major portion of the input signal power range.

In a preferred embodiment of the method for linear and efficient amplification of an RF input signal, the load of the first amplifier device in the peak power region is reduced by at least about 50% from the load below the peak power region. The first amplifying device has a saturation power level and the peak power region preferably comprises the input signal power range greater than about 6–10 dB below the saturation power level. The second higher impedance of the second amplifier device may vary from a peak impedance value at a lower power level of the input signal to a second substantially constant impedance value at a higher power level of the input signal. The second amplifier device has a positive real impedance in at least a portion of the peak region of the input signal. The method preferably further comprises adjusting the relative phase of the amplified signal and the amplified sampled signal so as to be in phase at the output load. Sampling the input signal may comprise providing a 90 degree phase shifted sample of the input signal and adjusting the relative phase of the amplified signal and the amplified sampled signal compensates for the 90 degree phase shifting.

Adjusting the relative phase of the amplified signal and the amplified sampled signal may comprise passing the amplified sampled signal through a K inverter circuit.

Further features and advantages of the present invention will be appreciated from the following detailed description of the invention.

DETAILED DESCRIPTION OF THE INVENTION

The present invention provides a linearized high efficiency RF power amplifier and a method for linear amplification of an RF signal. A detailed circuit schematic of a preferred implementation of the amplifier is shown in FIG. 3, described below. First, however, the basic operational characteristics of amplifier devices employed in such circuit will be described in relation to FIG. 1 and FIG. 2.

Figure 1:
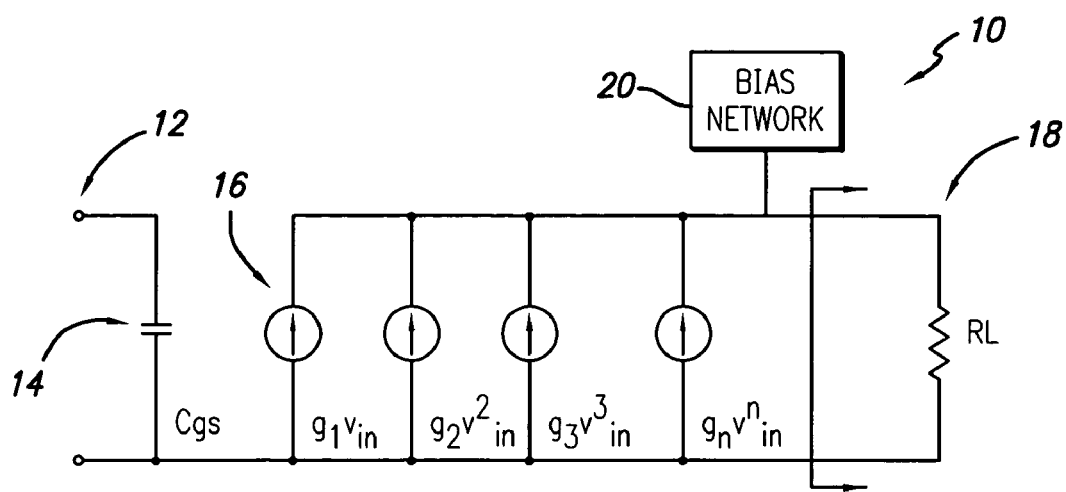
FIG. 1 is a schematic representation of a voltage controlled current source.

The basic structure of a controlled current source as embedded in an amplifier circuit 10 is shown in FIG. 1. This structure is a representation of a voltage controlled current source and is a simplified representation of solid-state devices such as a Field Effect Transistor (FET). The mechanisms responsible for the active device (transistor) nonlinearity are multifold. The device transconductance, the input and the output nonlinearities, all contribute to the amplifier distortion and are well known to those skilled in the art. The following description of the invention is equally applicable to other devices such as bipolar transistor technology.

Referring to FIG. 1, the amplifier circuit 10 includes a bias network 20 coupled to an active device which may be modeled as a plurality of current sources 16. An input signal $v_{in}$ is applied to input 12 and an output is provided via output load 18. The parasitic gate to source capacitance 14 is also shown. In this simple model of the device, the drain to source current is given by:

$$I_{DS}=g_0+g_1 v_{in}+g_2 v^2_{in}+g_3 v^3_{in}+ \ldots +g_n v^n_{in}. \quad (1)$$

In this near-ideal representation of the active device, the output power limitation is caused by the drain saturation current ($I_{DSS}$), which is a device physical limitation, and also the load resistance, once the device is embedded in an amplifier circuit. The point where the drain saturation current is reached is thus determined by $v_{in}$ assuming a fixed load 18.

In an amplifying circuit, the signal distortion is most pronounced when the device is driven into the saturation region by large $v_{in}$. That region is where the output signal will be clipped causing severe signal distortion. This situation arises when the RF voltage (the current supplied by the active device multiplied by the load value) exceeds the dc supply rail. Although in such mode of operation, the amplifier is very nonlinear, its efficiency is high. Hence, in applications with large signal envelope, the amplifier is normally operated in the back off region to avoid distortion, and therefore, its efficiency is fairly low.

The present invention provides an approach to amplifier linearization, where, for a given input excitation, the load value is dynamically changed and controlled by the envelope of the modulated signal. In this fashion, output clipping is avoided.

Figure 2:
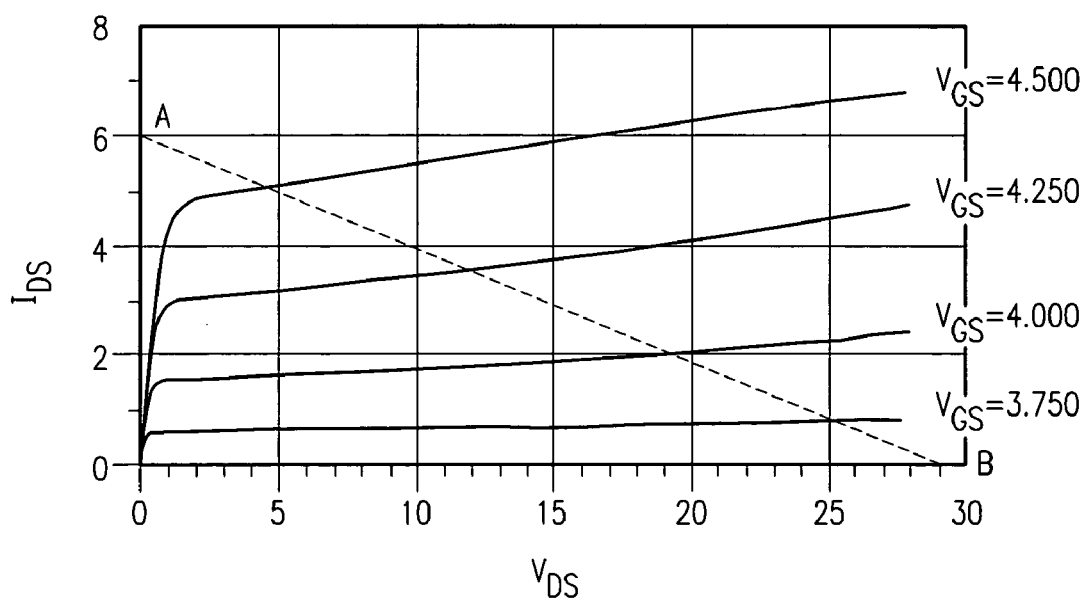
FIG. 2 is a graphical representation of current vs. voltage characteristics of an amplifier device showing the amplifier load line.
Figure 3:
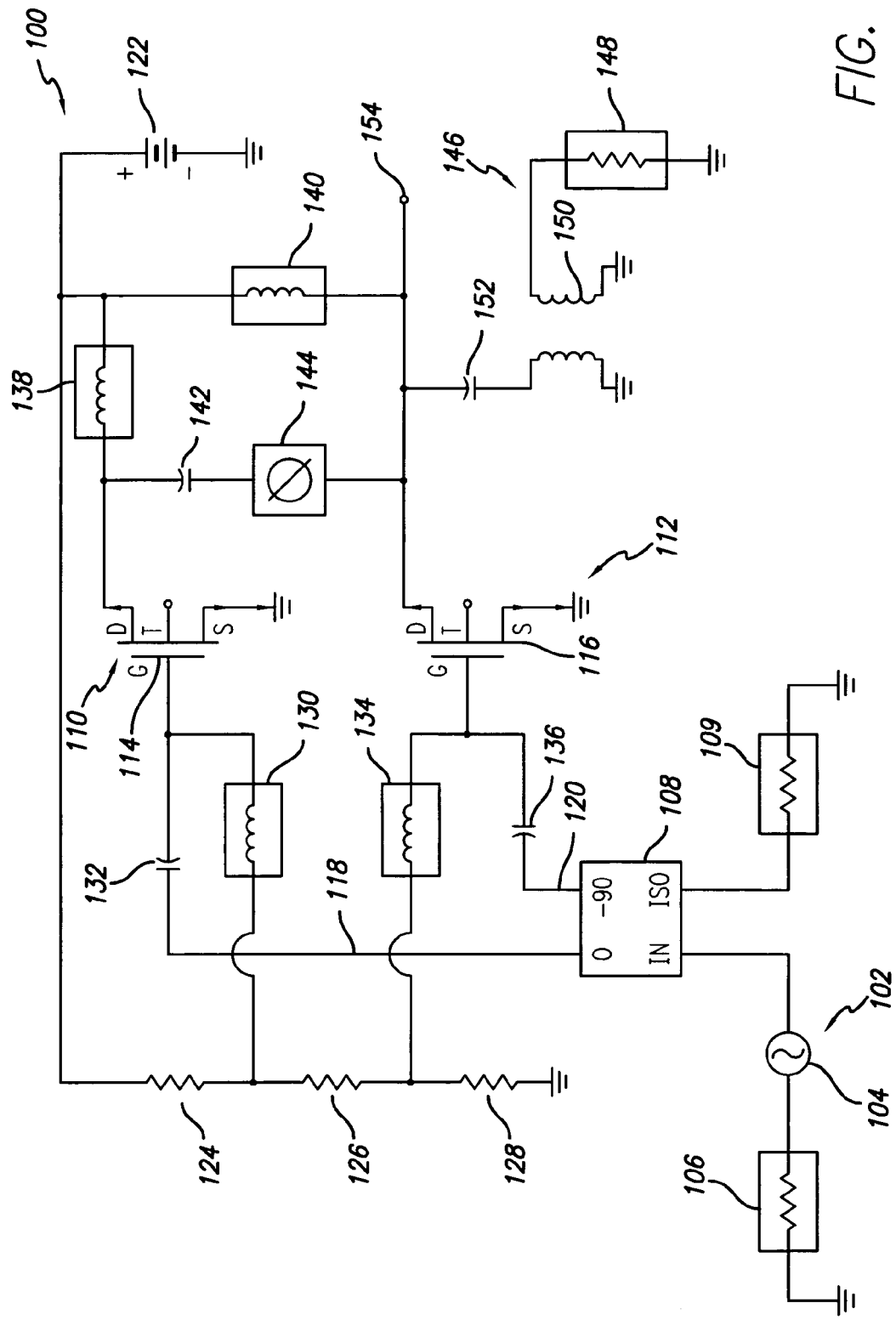
FIG. 3 is a schematic drawing of an amplifier circuit in accordance with one embodiment of the invention.

In FIG. 2, the drain to source current IDS for a typical FET solid state device is shown as a function of drain to source voltage $V_{DS}$ for various gate to source voltages $V_{GS}$. The line AB is determined by the output load 18 (shown in FIG. 1). In accordance with the present invention, the slope of line AB (the load line) is changed dynamically and in tune with the envelope of the carrier signal. When the envelope is small, the load is set to be larger than the nominal value to generate a larger RF voltage swing, just short of dc rail. This leads to an improvement of the dc to RF conversion efficiency. As signal envelope is increased, dynamic load pulling reduces the load to avoid distortion.

The power added efficiency η, as known to those skilled in the art, is defined as:

$$\eta = (\text{output } RF \text{ power} - \text{input } RF \text{ power})/dc \text{ input} \qquad (2)$$

In class AB mode of operation, the dc power ($I_{DS} \times VDC$) is dependant on quiescent current, and the efficiency of such amplifier is improved by maximizing the RF power in back off and this can be achieved by increasing the amplifier load. However, this will lead to nonlinearity and severe distortion at higher input levels. Therefore, when the input signal envelope goes through its peaks, the RF load will have to be reduced to prevent output clipping and maintain fidelity.

The linearization method of the present invention provides such a load pulling mechanism. A preferred implementation achieves this task by using a $2^{nd}$ current source (solid state device) that is activated to adjust the load dynamically, in accord with the signal envelope and avoids the output signal hitting the dc rail. One specific circuit implementation employing dynamic adjustment of the amplifier ac load line is schematically shown in FIG. 3.

Referring to FIG. 3, the amplifier circuit 100 includes an input 102 for receiving an RF input signal. The input signal is provided by input signal source 104 applied to the input and an input load 106. This input signal is divided into two paths 110, 112 by coupler 108, which may be a 90 degree hybrid coupler (HYB) with an isolation port coupled to a termination load 109. The signal on main path 110 is applied along line 118 to a main amplifying device 114 via capacitor 132, which is a dc block. In this implementation a radio frequency MOS device 114, such as an LDMOS device, is being used as the main amplifier device. A first bias circuit comprising the network of resistors 124, 126, 128 (values $R_2$, $R_3$ and $R_4$) supply the required gate bias to amplifier device 114 from DC power supply 122. These resistor values are adjusted to operate the device preferably in class A or AB mode of operation. DC feed circuit 130 acts as a low pass filter to stop the RF signal from leaking into the dc lines.

The power supply to the main amplifier device is provided from power supply 122 via DC feed circuit 138 which also blocks RF signals from the DC feed lines. The output of main amplifier device 114 is connected to output load 146 via phase shifter (PS) 144. Load 146 may comprise a conventional fixed load 148 and an inductive load 150, shown by a schematic representation of an RF transformer (TF). The role of the phase shifter 144 and its functionality will be discussed shortly. DC blocking capacitors 142, 152 are also shown. The combination of the inductive load 150 and the phase shifter 144 transform the load impedance of fixed load 148 into an appropriate level. Impedance scaling by a factor of k (1.5<k<3 larger than the nominal load value) will be suitable for typical applications. The load value seen by main amplifier device 114 will cause amplifier output clipping to happen at typically 6–10 dB input back off from device saturation. Hence, at this region, large output voltage swings are possible and high efficiency will be the result. Nonetheless, beyond this point, the amplifier output clipping leads to severe distortion if the load impedance value remains high. To avoid output clipping, the load of the main amplifier device is reduced as signal envelope increases.

Still referring to FIG. 3, a sample of the RF input is derived via input directional coupler 108 and provided to the second (auxiliary) signal path 112. The sampled signal is amplitude adjusted and phase conditioned to the appropriate level before it is combined with the main amplifier device current. More specifically, in the illustrated preferred embodiment the sampled input signal is provided to second (auxiliary) amplifier device 116 along line 120 via DC blocking capacitor 136. A second bias circuit comprising resistor network 124, 126, 128 coupled to DC power supply 122 sets the turn-on threshold of auxiliary amplifier 116. DC feed line 134 acts as a low pass filter blocking RF energy from the DC feed lines. The current produced by the auxiliary amplifier device is thus proportional to the envelope of the signal, i.e. this device will only supply current to the load 146 above a certain input threshold (e.g., 6–10 dB back off). The current from auxiliary amplifier device 116 is combined with the main device 114 output current before it is applied to output device 146. The addition of this (envelope controlled) current to the load results in the dynamic control of the load. The role of the phase shifter 144 is to introduce phase change and impedance inversion. Therefore, above the turn-on threshold of device 116, the load impedance experienced by device 114 is reduced. As a result linearization of the main amplifier device 114 is achieved by avoiding output clipping. The load current is thus composed of two in-phase components leading to higher peak power at amplifier output 154 resulting in improved overall efficiency at back off.

In FIG. 3, the two amplifying devices 114, 116 will normally be used with input and output matching circuits. The inclusion of distributed or lumped matching circuits will introduce phase changes, leading to load impedance inversions. In such circumstances, the role of devices 114, 116 may need to be exchanged, but the principle of operation remains unchanged.

Figure 4:
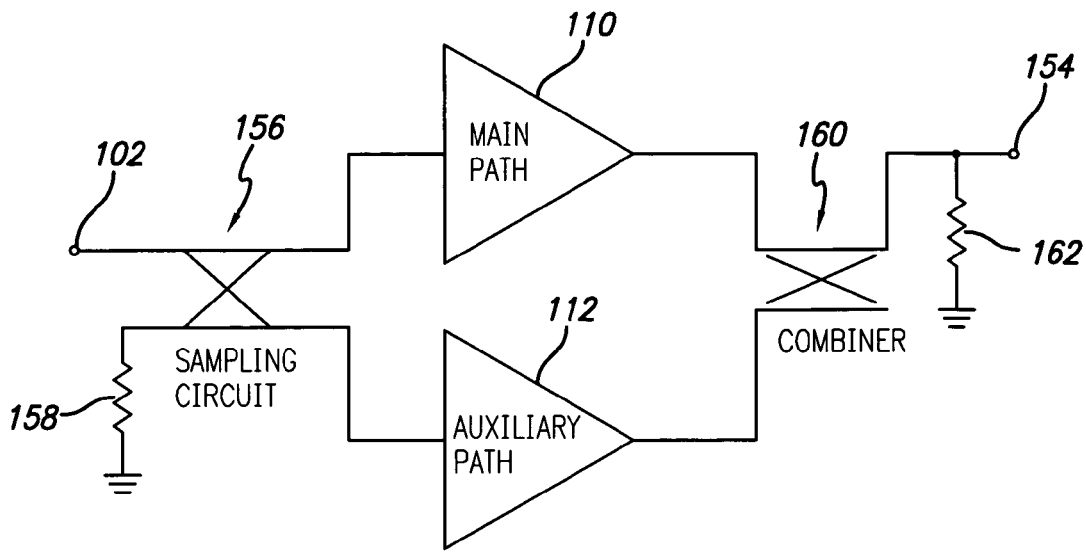
FIG. 4 is a schematic drawing of an alternate embodiment of the invention employing combiner circuitry at the RF frequency range.
Figure 5:
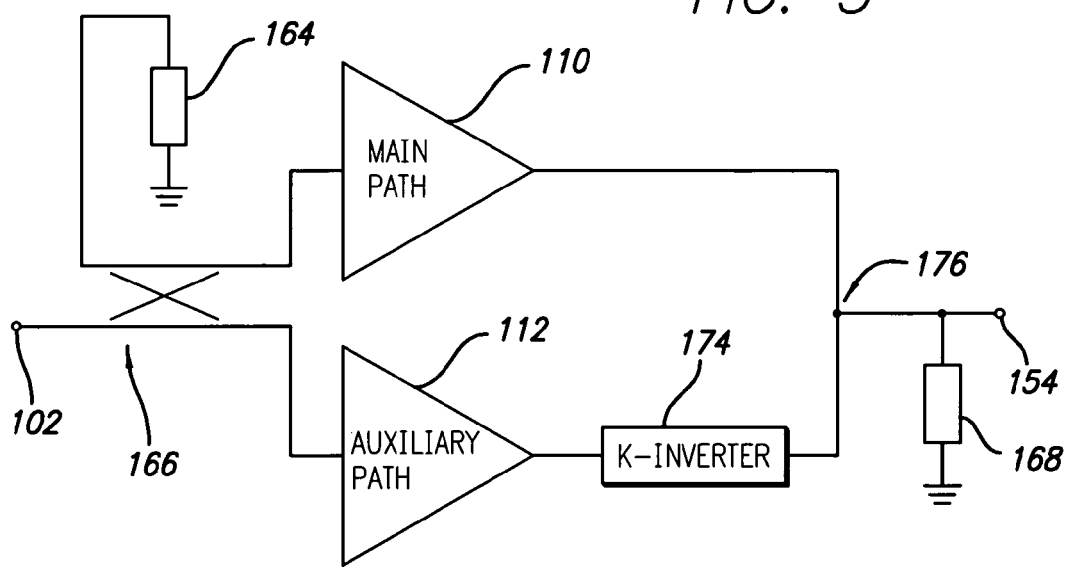
FIG. 5 is a schematic drawing of another embodiment of the invention employing an alternative amplifier combining arrangement.

FIGS. 4 and 5 depict alternative embodiments employing other combining arrangements. In the embodiments of FIGS. 4 and 5, as in the embodiment of FIG. 3 the signal in the auxiliary path is combined with the main path to provide dynamic load adjustment as described above.

In the embodiment of FIG. 4, an RF input signal is applied to input 102 and provided to sampling circuit 156, including termination load 158. Sampling circuit 156 may be any suitable sampling circuit known to those skilled in the art, including a hybrid coupler as described in relation to FIG. 3. The input signal and sampled input signal are provided along main and auxiliary paths 110, 112, respectfully, as in the embodiment of FIG. 3. An RF combiner 160 is then employed to combine the two signal paths and the output signal is provided to output 154 via RF load 162. The RF combiner 160 may be any suitable RF combiner of a type known to those skilled in the art. In this realization, the two arms are designed to have different transfer characteristics. While the main amplifier is designed to have a load for maximum efficiency at some back off signal level (6–10 dB), the 2nd amplifying branch is designed to have maximum peak power at full power.

In the embodiment of FIG. 5, the input signal at input 102 is similarly sampled by sampling circuit 166, including termination load 164, and provided along main and auxiliary paths 110, 112 to combiner 176 and to output 154 via RF load 168.

The arrangement shown in FIG. 5 can offer broadband response and ease of implementation. In this configuration the required phase shift between auxiliary path 112 and main path 110 is provided by a K-inverter 174, for example as described in Matthaei G., Young L. and Jones E. M. T., Microwave Filters, Impedance Matching, and Coupling structures, Artech House, ISBN: 0-89006-099-1, the disclosure of which is incorporated herein by reference.

For both the embodiments of FIGS. 4 and 5, as well as FIG. 3, the addition of the auxiliary arm output to the main signal path is equivalent to lowering the impedance of the load or to a change in the slope of the load line (FIG. 2). It should be noted that provided that a good phase balance is preserved between the main signal path and the auxiliary path, the power delivered to the load will be enhanced. Therefore, for all practical purposes, the circuit is configured to have a load impedance value, presented to the active device in the main path that is large compared to nominal load value. This load is gradually reduced, as the signal envelope increases above a threshold, and therefore, the device in the main path is loaded with an optimum load to avoid distortion. By decreasing the load at high input signal levels, the amplifier output voltage swing is lowered, preventing the excessive nonlinearity which would be the result otherwise. The control circuitry can take different forms and one mechanism for the control of the two current sources in the two signal paths is the bias of each stage as described above. As the main device will have to be active at lower envelope power levels, it will preferably be biased at class A or AB. The device in the auxiliary arm will be biased with smaller quiescent current, in which case, the drive signal level can turn this device on and allow the current to flow across the device and into the load. Other approaches to the control of the two current sources in the two signal paths may also be employed, however. For example, the envelope of the input signal can be extracted by using an envelope detector circuit. This information can be used for the control of the second current source in the auxiliary path 112.

Figure 6A:
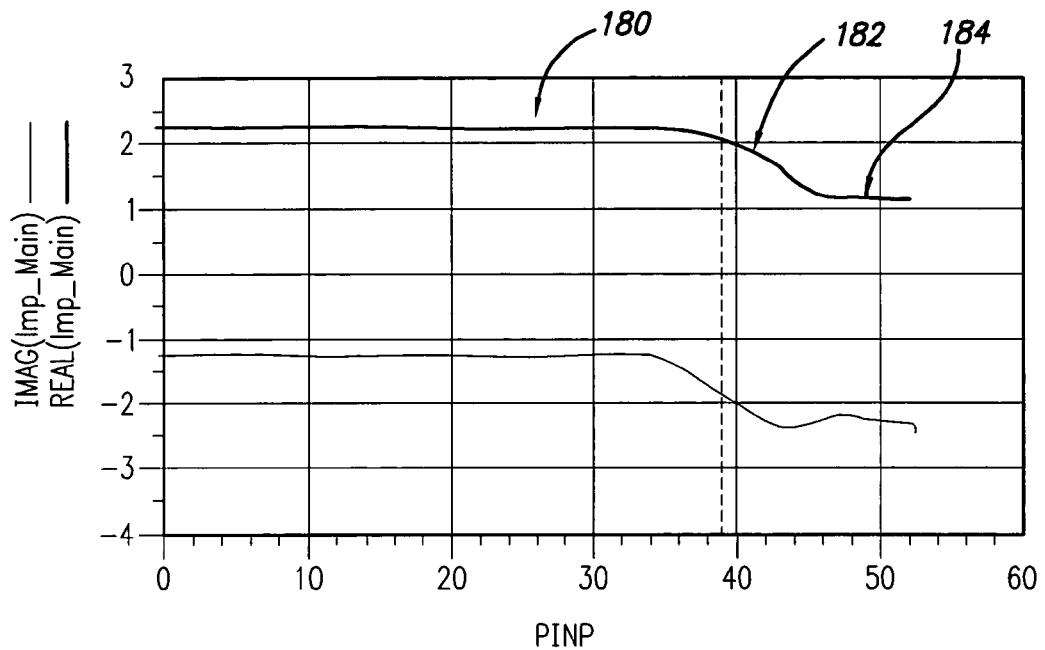
FIG. 6A is a graphical illustration of the load dynamics across the main amplifier device in the embodiment of FIG. 3.
Figure 6B:
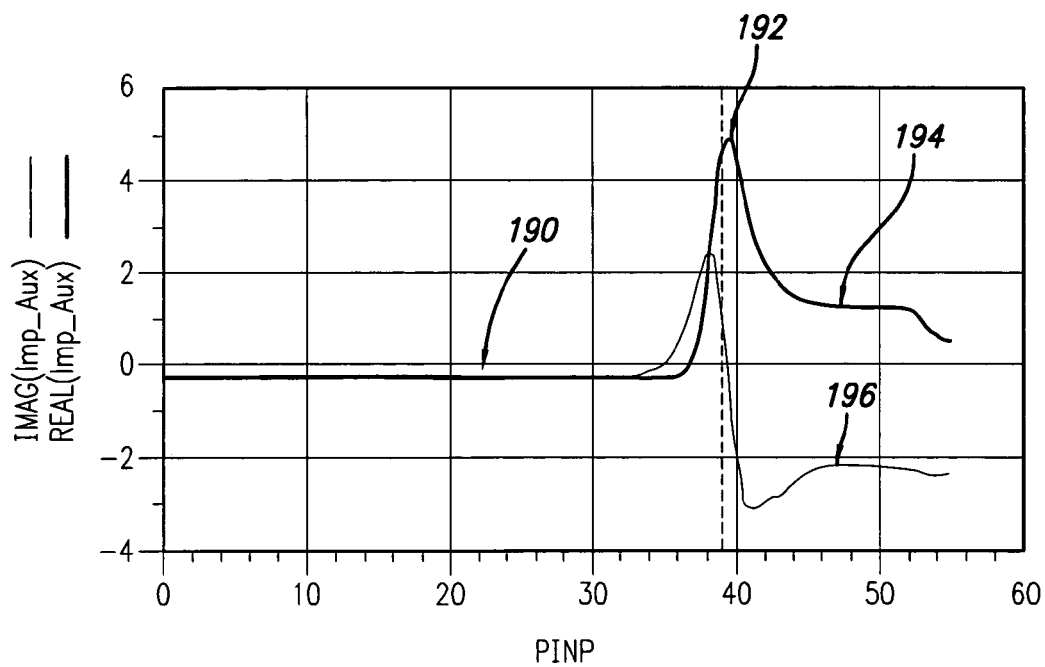
FIG. 6B is a graphical illustration of the load dynamics across the linearizing device in the embodiment of FIG. 3.

Referring to FIGS. 6A and 6B the results from a computer modeling of the circuit of FIG. 3 showing the dynamics of load variation with signal level are illustrated. FIGS. 6A and 6B show the real and imaginary components of the impedance across the main and auxiliary amplifier devices, respectfully, as a function of input signal power (in dBm). FIG. 6A shows that the real part of the load impedance is larger at the lower power region 180, and it drops through a transitional region 182 as the input signal level is increased above the turn-on threshold (dashed line) of the auxiliary device and the load pulling is activated. The main device impedance then stabilizes at a substantially lower real part of impedance value (e.g. about 50% of maximum impedance) at a higher power region 184. As shown in FIG. 6B, in the auxiliary signal path the load impedance measured across the auxiliary device terminal is approximately zero (but looks slightly negative) in the region 190 when the auxiliary device is inactive, i.e., below the turn-on threshold (dashed line). This is indicative of the fact that this device absorbs very small RF power in this mode (this loss of output power is outweighed by the improvements of main path efficiency). As the input signal level is increased, the auxiliary device is turned on and starts supplying current into the load. At some intermediate level, a relatively large impedance 192 is observed across the auxiliary device (little or no current flow into the $2^{nd}$ arm). At larger powers, the load impedance observed by the $2^{nd}$ arm stabilizes in region 194. The auxiliary device impedance in region 194 is substantially the same as the impedance value experienced by the main arm in region 184. In this region the imaginary component of the auxiliary device impedance 196 is negative. The comparison of the two graphs 6A and 6B thus shows that the load across the main device is dynamically changed (reduced) to improve the linearity and prevent output clipping/distortion.

The foregoing descriptions of preferred embodiments of the invention are purely illustrative and are not meant to be limiting in nature. Those skilled in the art will appreciate that a variety of modifications are possible while remaining within the scope of the present invention.

What is claimed is:

1. A power amplifier adapted for amplifying an RF input signal, comprising:
   an input for receiving an RF input signal;
   an amplifier device coupled to the input and receiving the input signal and providing an amplified output signal;
   a dynamically varying output load coupled to the amplifier device, including a variable impedance device coupled to the amplifier device so as to vary the impedance across the amplifier device as a function of an input signal, wherein the impedance across a amplifier device is substantially constant through a first portion of the input signal power range corresponding to the lower major portion of the input signal power range and drops substantially for a second portion of the input signal power range having higher power than said first portion of the input signal power range, the variable impedance device having approximately zero impedance through said first portion of the input signal power range and a substantially greater impedance through said second portion of the input signal power range; and
   an output coupled to the output load for outputting the amplified output signal,
   wherein said second portion of the input signal power range comprises the input signal power range greater than about 6–10 dB below the amplifier device saturation region and wherein the impedance across the amplifier device in said second portion of the input signal power range is about 50% of the impedance across the amplifier device in said first portion of the input signal power range.

2. A power amplifier adapted for amplifying an RF input signal, comprising:
   an input for receiving an RF input signal;
   an amplifier device coupled to the input and receiving the input signal and providing an amplified output signal;
   a dynamically varying output load coupled to the amplifier device, including a variable impedance device coupled to the amplifier device so as to vary the impedance across the amplifier device as a function of the input signal, wherein the impedance across the amplifier device is substantially constant through a first portion of an input signal power range corresponding to a lower major portion of the input signal power range and drops substantially for a second portion of the input signal power range having higher power than said first portion of the input signal power range, the variable impedance device having approximately zero impedance through said first portion of the input signal power range and a substantially greater impedance through said second portion of the input signal power range; and
   an output coupled to the output load for outputting the amplified output signal,
   wherein said variable impedance device presents negligible load to the amplifier device in said first portion of the input signal power range.

3. A power amplifier adapted for amplifying an RF input signal, comprising:
   an input for receiving an RF input signal;
   an amplifier device coupled to the input and receiving the input signal and providing an amplified output signal;
   a dynamically varying output load coupled to the amplifier device, including a variable impedance device coupled to the amplifier device so as to vary the impedance across the amplifier device as a function of the input signal, wherein the impedance across the amplifier device is substantially constant through a first portion of an input signal power range corresponding to a lower major portion of the input signal power range and drops substantially for a second portion of the input signal power range having higher power than said first portion of the input signal power range, the variable impedance device having approximately zero impedance through said first portion of the input signal power range and a substantially greater impedance through said second portion of the input signal power range; and
   an output coupled to the output load for outputting the amplified output signal,
   wherein said variable impedance device has an impedance peak in a lower power region of said second portion of the input signal power range and a substantially constant impedance in a higher power region of said second portion of the input signal power range.

4. A power amplifier as set out in claim 3, wherein said substantially constant impedance of said variable impedance device is approximately equal to the impedance across said amplifier device in said higher power region of said second portion of the input signal power range.

5. A power amplifier adapted for amplifying an RF input signal, comprising:
   an input for receiving an RF input signal;
   an amplifier device coupled to the input and receiving the input signal and providing an amplified output signal;
   a dynamically varying output load coupled to the amplifier device, including a variable impedance device coupled to the amplifier device so as to vary the impedance across the amplifier device as a function of the input signal, wherein the impedance across the amplifier device is substantially constant through a first portion of an input signal power range corresponding to a lower major portion of the input signal power range and drops substantially for a second portion of an input signal power range having higher power than said first portion of the input signal power range, the variable impedance device having approximately zero impedance through said first portion of the input signal power range and a substantially greater impedance through said second portion of the input signal power range; and
   an output coupled to the output load for outputting the amplified output signal,
   wherein said dynamically varying output load further comprises a fixed load and wherein said variable impedance device is coupled in parallel with said amplifier device to said fixed load.

6. A power amplifier adapted for amplifying an RF input signal, comprising:
   an input for receiving an RF input signal;
   an amplifier device coupled to the input and receiving the input signal and providing an amplified output signal;
   a dynamically varying output load coupled to the amplifier device, including a variable impedance device coupled to the amplifier device so as to vary the impedance across the amplifier device as a function of the input signal, wherein the impedance across the amplifier device is substantially constant through a first portion of an input signal power range corresponding to a lower major portion of the input signal power range and drops substantially for a second higher power portion of the input signal power range having higher power than said first portion of the input signal power range, the variable impedance device having approximately zero impedance through said first portion of the input signal power range and a substantially greater impedance through said second higher power portion of the input signal power range; and
   an output coupled to the output load for outputting the amplified output signal,
   wherein said amplifier device comprises a field effect transistor biased in class A or class AB.

7. A power amplifier as set out in claim 5, wherein said dynamically varying output load further comprises transformer means for transforming the impedance of said fixed load by a factor of about 1.5–3.

8. A power amplifier as set out in claim 5, wherein said dynamically varying output load further comprises means for adjusting the relative phase of the signals applied to said fixed load from said variable impedance device and said amplifier device.

9. A power amplifier circuit, comprising:
   an input for receiving an input signal;
   a coupler for receiving the input signal and splitting the input signal on two signal paths;
   a first amplifier device coupled to the coupler on a first of the two signal paths and receiving the input signal and providing a first amplified signal, said first amplifier device having a first turn-on threshold;
   a second amplifier device coupled to the coupler on a second of the two signal paths and receiving the input signal and providing a second amplified signal, said second amplifier device having a second turn-on threshold and an impedance near zero when said input signal is below said second turn-on threshold;

an output load coupled to said first and second amplifier devices;

a DC power supply;

a first bias circuit coupled to the first amplifier device and the DC power supply and providing a first bias to the first amplifier device setting the first turn-on threshold of said first amplifier device;

a second bias circuit coupled to the second amplifier device and the DC power supply and providing a second bias to the second amplifier device setting the second turn-on threshold of said second amplifier device at a substantially higher level than said first turn-on threshold, said second turn-on threshold corresponding to a peak power region of the input signal; and an output coupled to the first and second amplifier devices via said output load and providing an amplified output signal, wherein said second turn-on threshold of said second amplifier device is about 6–10 dB below device saturation of said first amplifier device.

10. A power amplifier circuit, comprising:

an input for receiving an input signal;

a coupler for receiving the input signal and splitting the input signal on two signal paths;

a first amplifier device coupled to the coupler on a first of the two signal paths and receiving the input signal and providing a first amplified signal, said first amplifier device having a first turn-on threshold;

a second amplifier device coupled to the coupler on a second of the two signal paths and receiving the input signal and providing a second amplified signal, said second amplifier device having a second turn-on threshold and an impedance near zero when said input signal is below said second turn-on threshold;

an output load coupled to said first and second amplifier devices;

a DC power supply;

a first bias circuit coupled to the first amplifier device and the DC power supply and providing a first bias to the first amplifier device setting the first turn-on threshold of said first amplifier device;

a second bias circuit coupled to the second amplifier device and the DC power supply and providing a second bias to the second amplifier device setting the second turn-on threshold of said second amplifier device at a substantially higher level than said first turn-on threshold, said second turn-on threshold corresponding to a peak power region of the input signal; and an output coupled to the first and second amplifier devices via said output load and providing an amplified output signal, wherein said second amplifier device has a transitional region after the turn-on threshold and a fully turned on region at higher power and a real component of the impedance across said first and second amplifier devices are substantially equal when said second amplifier device is in the fully turned on region.

11. A power amplifier circuit as set out in claim 10, wherein said first and second amplifier devices are field effect transistors and have respective source and gate terminals, and are coupled to receive said input signal applied to their respective gate terminals and wherein said first and second bias circuits are coupled to the respective gate terminals of said first and second amplifier devices.

12. A power amplifier circuit as set out in claim 11, wherein said first and second bias circuits provide first and second fixed voltage bias levels to the respective gate terminals of said first and second amplifier devices to set the respective turn-on thresholds of said first and second amplifier devices.

13. A power amplifier circuit as set out in claim 12, wherein said first and second bias circuits comprise first and second resistor networks coupled to said DC supply and the respective gate terminals of said first and second amplifier devices.

14. A power amplifier circuit as set out in claim 13, wherein said first and second resistor networks comprise one or more common resistors.

15. A power amplifier circuit as set out in claim 13, wherein said first and second bias circuits further comprise first and second low pass matching circuits coupled between said DC supply and the respective gate terminals of said first and second amplifier devices.

16. A power amplifier circuit, comprising:

an input for receiving an input signal;

a coupler for receiving the input signal and splitting the input signal on two signal paths;

a first amplifier device coupled to the coupler on a first of the two signal paths and receiving the input signal and providing a first amplified signal, said first amplifier device having a first turn-on threshold;

a second amplifier device coupled to the coupler on a second of the two signal paths and receiving the input signal and providing a second amplified signal, said second amplifier device having a second turn-on threshold and an impedance near zero when said input signal is below said second turn-on threshold;

an output load coupled to said first and second amplifier devices;

a DC power supply;

a first bias circuit coupled to the first amplifier device and the DC power supply and providing a first bias to the first amplifier device setting the first turn-on threshold of said first amplifier device;

a second bias circuit coupled to the second amplifier device and the DC power supply and providing a second bias to the second amplifier device setting the second turn-on threshold of said second amplifier device at a substantially higher level than said first turn-on threshold, said second turn-on threshold corresponding to a peak power region of the input signal;

an output coupled to the first and second amplifier devices via said output load and providing an amplified output signal; and a 90 degree phase inverting circuit coupled between said output load and said first or second amplifier device.

17. A power amplifier circuit as set out in claim 16, wherein said phase inverting circuit is a K inverter circuit.

18. A power amplifier circuit as set out in claim 16, wherein said coupler comprises a 90 degree hybrid coupler and wherein said phase inverting circuit adjusts the relative phase of the first and second amplified signals from said first and second amplifiers to compensate for the effect of the 90 degree hybrid coupler and relative phase shifts introduced by the amplifier devices and bias circuits.

19. A power amplifier circuit, comprising:

an input for receiving an input signal;

a coupler for receiving the input signal and splitting the input signal on two signal paths;

a first amplifier device coupled to the coupler on a first of the two signal paths and receiving the input signal and providing a first amplified signal, said first amplifier device having a first turn-on threshold;

a second amplifier device coupled to the coupler on a second of the two signal paths and receiving the input signal and providing a second amplified signal, said second amplifier device having a second turn-on threshold and an impedance near zero when said input signal is below said second turn-on threshold;

an output load coupled to said first and second amplifier devices;

a DC power supply;

a first bias circuit coupled to the first amplifier device and the DC power supply and providing a first bias to the first amplifier device setting the first turn-on threshold of said first amplifier device;

a second bias circuit coupled to the second amplifier device and the DC power supply and providing a second bias to the second amplifier device setting the second turn-on threshold of said second amplifier device at a substantially higher level than said first turn-on threshold, said second turn-on threshold corresponding to a peak power region of the input signal;

an output coupled to the first and second amplifier devices via said output load and providing an amplified output signal; and a transformer coupled to said first and second amplifier devices in parallel with said output load.

20. A method for linear and efficient amplification of an RF input signal, comprising:

receiving an RF input signal having an input signal power range;

sampling the input signal to provide a sampled input signal;

amplifying the input signal with a first amplifier device and applying the amplified input signal across a load to provide an output signal;

amplifying the sampled input signal with a second amplifier device and applying the amplified sampled input signal to the output load in parallel with said amplified input signal; and dynamically varying the impedance of said second amplifier device from a first impedance having a substantially constant near zero value over a lower major portion of the input signal power range to a second impedance having a higher value than said first impedance in a peak power region of the input signal to substantially reduce the load of the first amplifier device when the input signal approaches the peak power region while maintaining the load substantially constant over the lower major portion of the input signal power range, wherein dynamically varying the impedance of said second amplifier device to substantially reduce the load of the first amplifier device comprises reducing said load in the peak power region by at least about 50% from the load below the peak power region.

21. A method for linear and efficient amplification of an RF input signal as set out in claim 20, wherein the first amplifying device has a saturation power level and wherein said peak power region comprises the input signal power range greater than about 6–10 dB below the saturation power level.

22. A method for linear and efficient amplification of an RF input signal, comprising:

receiving an RF input signal having an input signal power range;

sampling the input signal to provide a sampled input signal;

amplifying the input signal with a first amplifier device and applying the amplified input signal across a load to provide an output signal;

amplifying the sampled input signal with a second amplifier device and applying the amplified sampled input signal to the output load in parallel with said amplified input signal; and dynamically varying the impedance of said second amplifier device from a first impedance having a substantially constant near zero value over a lower major portion of the input signal power range to a second impedance having a higher value than said first impedance in a peak power region of the input signal to substantially reduce the load of the first amplifier device when the input signal approaches the peak power region while maintaining the load substantially constant over the lower major portion of the input signal power range, wherein said second higher impedance of the second amplifier device varies from a peak impedance value at a lower power level of the input signal to a second substantially constant impedance value at a higher power level of the input signal.

23. A method for linear and efficient amplification of an RF input signal, comprising:

receiving an RF input signal having an input signal power range;

sampling the input signal to provide a sampled input signal;

amplifying the input signal with a first amplifier device and applying the amplified input signal across a load to provide an output signal;

amplifying the sampled input signal with a second amplifier device and applying the amplified sampled input signal to the output load in parallel with said amplified input signal; and dynamically varying the impedance of said second amplifier device from a first impedance having a substantially constant near zero value over a lower major portion of the input signal power range to a second impedance having a higher value than said first impedance in a peak power region of the input signal to substantially reduce the load of the first amplifier device when the input signal approaches the peak power region while maintaining the load substantially constant over the lower major portion of the input signal power range, wherein said second amplifier device has a positive real impedance in at least a portion of said peak power region of the input signal.

24. A method for linear and efficient amplification of an RF input signal, comprising:

receiving an RF input signal having an input signal power range;

sampling the input signal to provide a sampled input signal;

amplifying the input signal with a first amplifier device and applying the amplified input signal across a load to provide an output signal;

amplifying the sampled input signal with a second amplifier device and applying the amplified sampled input signal to the output load in parallel with said amplified input signal;

dynamically varying the impedance of said second amplifier device from a first impedance having a substantially constant near zero value over a lower major portion of the input signal power range to a second impedance having a higher value than said first impedance in a peak power region of the input signal to substantially reduce the load of the first amplifier device when the input signal approaches the peak power region while maintaining the load substantially constant over the lower major portion of the input signal power range; and adjusting the relative phase of the amplified input signal and the amplified input sampled signal so as to be in phase at the output load.

25. A method for linear and efficient amplification of an RF input signal as set out in claim 24, wherein sampling the input signal comprises providing a 90 degree phase shifted sample of the input signal and wherein said adjusting the relative phase of the amplified signal and the amplified sampled input signal compensates for said 90 degree phase shifting.

26. A method for linear and efficient amplification of an RF input signal as set out in claim 24, wherein adjusting the relative phase of the amplified signal and the amplified sampled input signal comprises passing the amplified sampled input signal through a K inverter circuit.

* * * * *